(12) United States Patent
Yamamoto

(10) Patent No.: US 9,312,519 B2
(45) Date of Patent: Apr. 12, 2016

(54) ORGANIC LIGHT EMITTING ELEMENT, ORGANIC EL DISPLAY PANEL, ORGANIC EL DISPLAY DEVICE, COATED DEVICE, AND METHOD FOR MANUFACTURING THESE

(71) Applicant: PANASONIC CORPORATION, Osaka (JP)

(72) Inventor: Tsuyoshi Yamamoto, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/402,338

(22) PCT Filed: Sep. 26, 2012

(86) PCT No.: PCT/JP2012/006122
§ 371 (c)(1),
(2) Date: Nov. 20, 2014

(87) PCT Pub. No.: WO2013/179362
PCT Pub. Date: Dec. 5, 2013

(65) Prior Publication Data
US 2015/0137087 A1     May 21, 2015

(30) Foreign Application Priority Data

Jun. 1, 2012    (JP) ................................ 2012-125832

(51) Int. Cl.
*H01L 51/56*    (2006.01)
*H01L 51/00*    (2006.01)
(Continued)

(52) U.S. Cl.
CPC ............ *H01L 51/56* (2013.01); *H01L 27/3246* (2013.01); *H01L 51/0004* (2013.01); *H01L 51/0005* (2013.01); *H01L 51/52* (2013.01); *H01L 27/3211* (2013.01)

(58) Field of Classification Search
CPC ..... H01L 51/52; H01L 51/56; H01L 51/0005; H01L 51/0004; H01L 27/3246; H01L 27/3211; H01L 51/0012; H01L 51/0015; H01L 51/5262; H01L 51/5275
USPC ............................. 257/40; 438/34, 42, 46, 32
See application file for complete search history.

(56) References Cited

U.S. PATENT DOCUMENTS

| 5,443,922 A | 8/1995 | Nishizaki et al. |
| 8,203,158 B2 | 6/2012 | Yoshida et al. |
| 8,778,712 B2 | 7/2014 | Takeuchi |

(Continued)

FOREIGN PATENT DOCUMENTS

| JP | 05-163488 | 6/1993 |
| JP | 2006-223954 | 8/2006 |

(Continued)

*Primary Examiner* — Victoria K Hall
(74) *Attorney, Agent, or Firm* — Greenblum & Bernstein, P.L.C.

(57) ABSTRACT

An organic light-emitting element including: a substrate; a light-emitting part above the substrate, the light-emitting part including an organic layer; and banks defining bounds of the organic layer in a direction along a main surface of the substrate. In the organic light-emitting element, in plan view, a surface of the organic layer is longer in a first direction than in a second direction perpendicular to the first direction, and in the second direction, the surface of the organic layer is convex, protruding upwards in a thickness direction of the organic layer, and in the first direction, the surface of the organic layer is concave, protruding downwards in the thickness direction.

16 Claims, 12 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 8,852,977 B2 | 10/2014 | Nishiyama | |
| 8,866,160 B2 | 10/2014 | Nishiyama | |
| 2004/0021413 A1* | 2/2004 | Ito | H01L 27/3246 313/504 |
| 2004/0113550 A1* | 6/2004 | Adachi | H01L 27/3246 313/512 |
| 2007/0263164 A1* | 11/2007 | Kumagai | H01L 27/3246 349/156 |
| 2010/0181554 A1* | 7/2010 | Yoshida | H01L 51/5209 257/40 |
| 2010/0188609 A1* | 7/2010 | Matsuki | G02B 19/0014 349/64 |
| 2010/0327297 A1* | 12/2010 | Yoshida | H01L 27/3211 257/89 |
| 2012/0080694 A1* | 4/2012 | Yoshida | H01L 27/3211 257/89 |
| 2012/0091440 A1* | 4/2012 | Matsushima | H01L 27/3211 257/40 |
| 2012/0217518 A1* | 8/2012 | Abe | H01L 27/3246 257/88 |
| 2013/0099258 A1* | 4/2013 | Lim | H01L 51/5209 257/88 |
| 2013/0105781 A1* | 5/2013 | Matsushima | H01L 27/3258 257/40 |
| 2013/0285032 A1 | 10/2013 | Nanno et al. | |
| 2015/0330598 A1* | 11/2015 | Hwang | F21V 5/046 362/84 |

FOREIGN PATENT DOCUMENTS

| | | |
|---|---|---|
| JP | 2008-218253 | 9/2008 |
| JP | 2010-267428 | 11/2010 |
| WO | 2012/049713 | 4/2012 |

* cited by examiner

FIG. 9
(a)
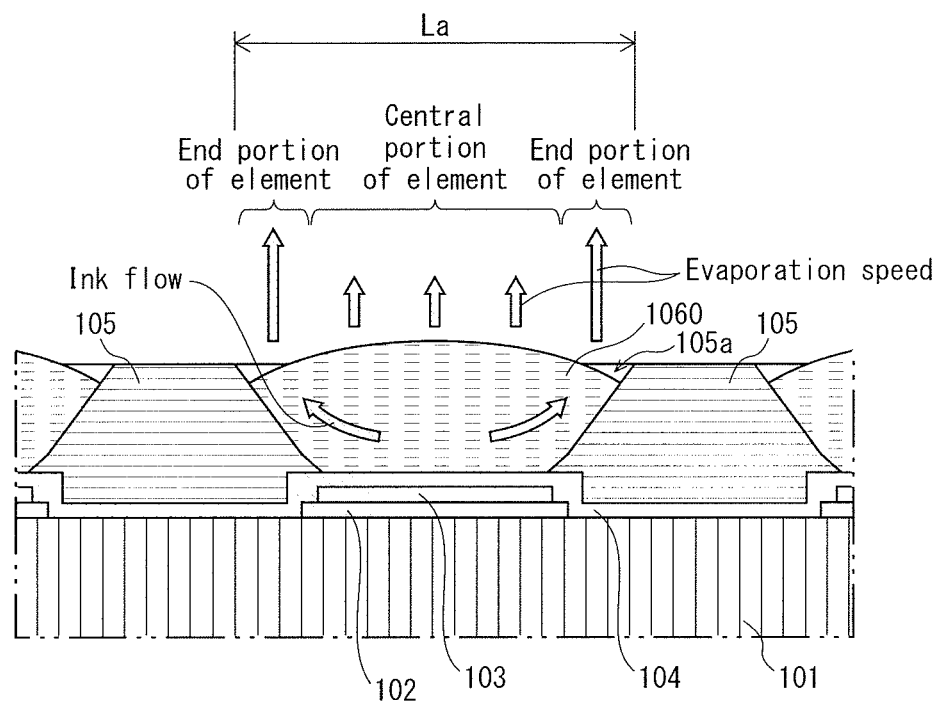
(b)
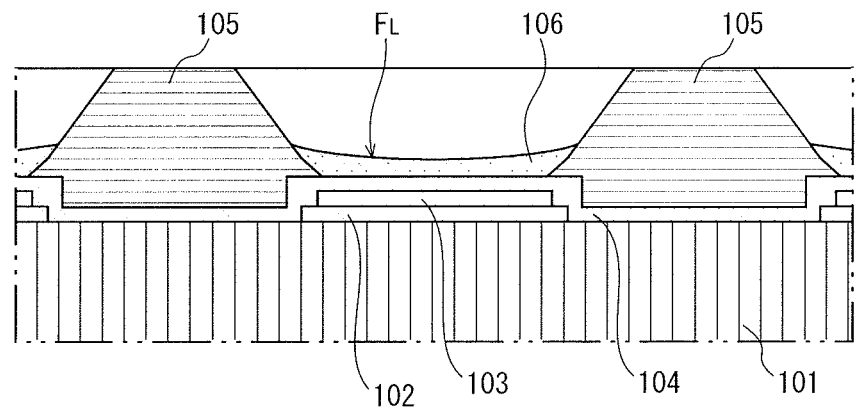
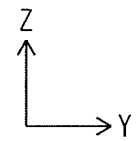

FIG. 11A

|  |  | Initial ink viscosity [mPa·s] | |
|---|---|---|---|
|  |  | 10.3 | 12.3 |
| Drying temperature [°C] | 25 | Sample 1 | Sample 6 |
|  | 50 | Sample 2 | Sample 7 |
|  | 60 | Sample 3 | Sample 8 |
|  | 70 | Sample 4 | Sample 9 |
|  | 80 | Sample 5 | Sample 10 |

FIG. 11B

|  | Minor-axis direction profile | Judgment |
|---|---|---|
| Sample 1 | Convex | OK |
| Sample 2 | Convex | OK |
| Sample 3 | Concave | NG |
| Sample 4 | Concave | NG |
| Sample 5 | Concave | NG |
| Sample 6 | Concave | NG |
| Sample 7 | Concave | NG |
| Sample 8 | Concave | NG |
| Sample 9 | Convex | OK |
| Sample 10 | Convex | OK |

Diagram of relationship between viscosity, drying temperature, and minor-axis direction shape

ORGANIC LIGHT EMITTING ELEMENT, ORGANIC EL DISPLAY PANEL, ORGANIC EL DISPLAY DEVICE, COATED DEVICE, AND METHOD FOR MANUFACTURING THESE

TECHNICAL FIELD

The present disclosure relates to an organic light-emitting element, an organic EL display panel, an organic EL display device, a device involving application of material (referred to as an "application-type device" in the following), and manufacturing methods thereof.

BACKGROUND ART

In recent years, research and development has progressed in organic electro-luminescent elements (organic EL elements), which make use of the electro-luminescence of organic material and are one type of organic light-emitting element. A typical organic EL element includes an anode, a cathode, and a light-emitting layer (an organic layer) between the anode and the cathode.

An organic EL display panel includes a two-dimensional array of pixels. Each pixel includes a plurality of sub-pixels. In an organic EL display panel, adjacent sub-pixels are partitioned from one another by banks that contain electrically-insulative material and define the shape of light-emitting layers in the sub-pixels.

Each sub-pixel (organic EL element) in an organic EL display device may include layers other than the electrodes and the light-emitting layer, as necessary. For example, a combination of a hole injection layer and a hole transport layer, or a hole injection/transport layer may be disposed between the anode and the light-emitting layer. For example, a combination of an electron injection layer and an electron transport layer, or an electron injection/transport layer may be disposed between the cathode and the light-emitting layer. In the following, the term "charge injection/transport layer" is used. A charge injection/transport layer may be any of: a hole injection layer; a hole transport layer; a hole injection/transport layer; an electron injection layer; an electron transport layer; and an electron injection/transport layer. Further, in the following, the term "functional layer" is used. A functional layer may be a light-emitting layer or any charge injection/transport layer. The term "functional layer" is used to refer to such layers because such layers each have a unique function. Specifically, a light-emitting layer has the function of emitting light, and a charge injection/transport layer has the function of injecting or transporting charge.

The manufacturing of an organic EL display panel includes a process of forming a functional layer above a substrate. Note that in the present disclosure, when a first layer is disposed "above" a second layer, the first layer may be disposed directly on the second layer so as to be in contact with the second layer, or may be disposed above the second layer without direct contact with the second layer. Typically, a functional layer is formed by using low molecular weight material and by performing vapor deposition. However, a functional layer may also be formed by performing a so-called "wet process". Forming a functional layer through a wet process involves first applying ink (application liquid) to fill a recess between banks through inkjet printing, and then drying the ink so applied. The ink contains functional layer material dissolved in a solvent. A wet process facilitates the forming of functional layers, even those in organic EL display panels of large size.

The thickness of a function layer is one factor having influence on light-emission characteristics of an organic EL element. Due to this, when forming functional layers in an organic EL display panel through a wet process, it is preferable that recesses between banks are filled with a similar amount of ink, and that a functional layer formed with respect to each recess has uniform thickness and a high level of planarity.

Conventionally, ink for a functional layer includes a solvent having a high boiling point. To cause such a solvent to evaporate, after being applied to fill recesses above a substrate, the ink is dried by decompression-drying the substrate in a drying machine.

CITATION LIST

Patent Literature

[Patent Literature 1]
Japanese Patent Application Publication No. 2006-223954
[Patent Literature 2]
Japanese Patent Application Publication No. 2008-218253

SUMMARY

Technical Problem

Increasing uniformity of a functional layer in terms of thickness (increasing planarity of the functional layer) provides an element including the functional layer, which for example may be an organic EL element, with improved characteristics.

The present disclosure aims to provide a solution to such technical problem. That is, the present disclosure ensures that a functional layer formed through a wet process has high uniformity in terms of thickness. Thus, the present disclosure provides an organic light-emitting element, an organic EL display panel, an organic EL display device, and an application-type device, each of which having excellent characteristics, and manufacturing methods thereof.

Solution to Problem

In view of the above, the present disclosure provides, as one aspect thereof, an organic light-emitting element including: a substrate; a light-emitting part above the substrate, the light-emitting part including an organic layer; and banks defining bounds of the organic layer in a direction along a main surface of the substrate. In the organic light-emitting element pertaining to one aspect of the present disclosure, in plan view, a surface of the organic layer is longer in a first direction than in a second direction perpendicular to the first direction, and in the second direction, the surface of the organic layer is convex, protruding upwards in a thickness direction of the organic layer, and in the first direction, the surface of the organic layer is concave, protruding downwards in the thickness direction.

Advantageous Effects

In the organic light-emitting element pertaining to one aspect of the present disclosure, the surface of the organic layer is convex in the second direction and concave in the first direction. Thus, the surface of the organic layer has a large planar area. Thus, the organic layer in the organic light-emitting element pertaining to one aspect of the present disclosure has high uniformity in terms of thickness.

Accordingly, the organic light-emitting element pertaining to one aspect of the present disclosure has excellent characteristics.

BRIEF DESCRIPTION OF DRAWINGS

FIG. 9 includes portion (a) being a cross-sectional view schematically illustrating a state immediately after ink is applied to fill a recess, and portion (b) being a cross-sectional view schematically illustrating a shape of a light-emitting layer 106 after drying.

FIG. 11A is a chart illustrating a relationship between samples in a confirmation test and initial ink viscosities and drying temperatures therefor, and FIG. 11B is a chart illustrating results and surface profiles of cross-sections, in a minor-axis direction, of samples in a confirmation test.

DESCRIPTION OF EMBODIMENT

Figure 1:
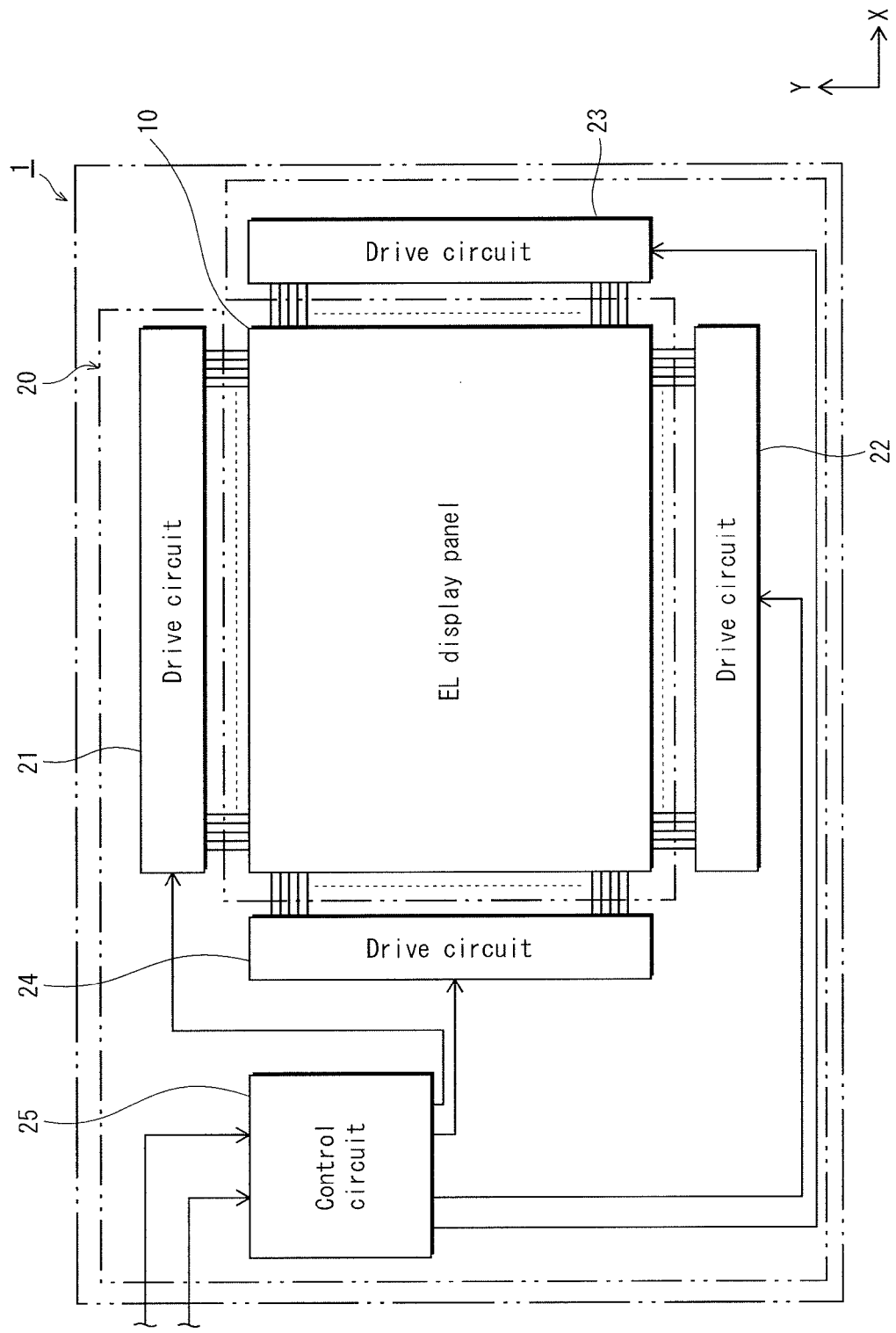
FIG. 1 is a schematic block diagram illustrating a structure of an organic EL display device 1 pertaining to an embodiment of the present disclosure.

How Aspects of Present Disclosure were Arrived at

The following describes how the present inventors arrived at the aspects of the technology of the present disclosure.

(i) Typically, forming an organic layer through a wet process involves applying ink containing organic material to fill a recess surrounded by banks, and then decompression-drying the ink in a decompression vessel. The present inventors found that in the process of decompression-drying, vapor density (ambient atmosphere) at a central area of the recess differs from vapor density at end areas of the recess, which are areas of the recess near the banks. Here, vapor density refers to a density of vapor generated when drying of the ink is performed.

(ii) Specifically, evaporation of ink solvent from an ink puddle formed by the ink applied to fill the recess tends to occur more easily (at a higher rate) at the ends areas than at the central area. Thus, the drying of the ink progresses while evaporation occurs at different speeds at the central area of the recess and the end areas of the recess. Due to this, in the ink puddle, ink at the central area flows towards the end areas, which results in the organic material, as well as the ink solvent, flowing from the central area towards the end areas. As such, when conventional technology is applied, there is a tendency that an organic layer formed in the recess when the ink is dried has greater thickness at portions corresponding to end areas of the recess (referred to as end portions in the present disclosure) than at a portion corresponding to the central area of the recess (referred to as a central portion in the present disclosure). That is, a conventional organic layer has low uniformity in terms of thickness, which leads to nonuniform light emission.

(iii) The present inventors found that an organic layer having a larger planar area than a conventional organic layer can be formed by providing an organic layer such that in plan view, (i) a surface profile of the organic layer is convex, protruding upwards in a thickness direction of the organic layer, in a direction of a minor axis of a recess with respect to which the organic layer is formed (a direction in which short sides of the recess extend, referred to as a minor-axis direction in the following). In such an organic layer, the convex surface profile in the minor-axis direction interacts with a surface profile of the organic layer in a direction of a major axis of the recess (a direction in which long sides of the recess extend, referred to as a major-axis direction in the following), which is concave, protruding downwards in the thickness direction. This results in the organic layer having a large planar area than that provided by conventional technology. That is, in an organic layer having a convex surface profile in the minor-axis direction and a concave surface profile in the major-axis direction, the different surface profiles of the different directions (i.e., the different thicknesses in the different directions) cancel each other out, resulting in the organic layer having a large planar area than that provided by conventional technology.

(iv) Note that the present inventors found that an organic layer having a convex surface profile in the minor-axis direction and a concave surface profile in the major-axis direction can be yielded by controlling factors such as: the length, in the major-axis direction and the minor-axis direction, of the recess in which the organic layer is formed; the viscosity of the ink used for forming the organic layer; and the temperature and the speed at which the drying is performed.

ASPECTS OF PRESENT DISCLOSURE

One aspect of the present disclosure is an organic light-emitting element including: a substrate; a light-emitting part above the substrate, the light-emitting part including an organic layer; and banks defining bounds of the organic layer in a direction along a main surface of the substrate. In the organic light-emitting element pertaining to one aspect of the present disclosure, in plan view, a surface of the organic layer is longer in a first direction than in a second direction perpendicular to the first direction, and in the second direction, the surface of the organic layer is convex, protruding upwards in a thickness direction of the organic layer, and in the first direction, the surface of the organic layer is concave, protruding downwards in the thickness direction.

In the organic light-emitting element pertaining to one aspect of the present disclosure, in plan view, the surface of the organic layer is longer in the first direction than in the second direction. Further, the surface of the organic layer is concave in the first direction and convex in the second direction. At the surface of the organic layer, the concave shape in the first direction and the convex shape in the second direction cancel each other out. Thus, in the organic light-emitting element pertaining to one aspect of the present disclosure, the surface of the organic layer, which is formed within a recess, has a larger planar area than conventionally provided. Accordingly, in the organic light-emitting element pertaining to one aspect of the present disclosure, the organic layer has high uniformity in terms of thickness.

Consequently, the organic light-emitting element pertaining to one aspect of the present disclosure has excellent element characteristics.

In the organic light-emitting element pertaining to one aspect of the present disclosure, for example, in the second direction, a central portion of the surface of the organic layer may protrude upwards in the thickness direction to be higher than end portions of the surface of the organic layer, and in the first direction, end portions of the surface of the organic layer may protrude upwards in the thickness direction to be higher than a central portion of the surface of the organic layer.

In the organic light-emitting element pertaining to one aspect of the present disclosure, for example, ink containing organic material, applied with respect to a recess surrounded by the banks and then dried, may form the organic layer.

In the organic light-emitting element pertaining to one aspect of the present disclosure, a ratio of a length of the organic layer in the first direction to a length of the organic layer in the second direction may be between 3:1 and 5:1. When the ratio of the length in the first direction to the length in the second direction is within this range, the surface of the organic layer is concave in the first direction, which corresponds to the major-axis direction, and convex in the second direction, which corresponds to the minor-axis direction.

Meanwhile, it is considered that the following takes place when the ratio of the length in the first direction to the length in the second direction is not within this range.

(i) When the difference between the length of the organic layer in the first direction and the length of the organic layer in the second direction is smaller than within the above range, the surface of the organic layer may be convex in both the first direction and the second direction, or may be concave in both directions.

(ii) When the difference between the length of the organic layer in the first direction and the length of the organic layer in the second direction is greater than within the above range, solid content of ink applied for forming the organic layer may be distributed unevenly at the point when drying of the ink is completed, existing at a greater amount at end portions of the organic layer in the first direction. When this situation occurs, the organic layer formed may not have a predetermined thickness at the central portion (e.g., a thickness of around 100 nm).

One aspect of the present disclosure is an organic EL display panel including a two-dimensional array of pixels each including a sub-pixel. In the organic EL display panel, in at least some of the pixels, the sub-pixel has the structure of the organic light-emitting element pertaining to one aspect of the present disclosure or any modified structure described above.

In the organic EL display panel pertaining to one aspect of the present disclosure, in at least some of the pixels, the sub-pixel has the structure of the organic light-emitting element pertaining to one aspect of the present disclosure or any modified structure described above. Thus, for the same reasons as described above, in at least some of the pixels, an organic layer in the sub-pixel has high uniformity in terms of thickness.

Consequently, the organic EL display panel pertaining to one aspect of the present disclosure has excellent display characteristics.

One aspect of the present disclosure is an organic EL display device including the organic EL display panel pertaining to one aspect of the present disclosure.

The organic EL display device pertaining to one aspect of the present disclosure, due to including the organic EL display panel pertaining to one aspect of the present disclosure, has excellent display characteristics for the same reasons as described above.

One aspect of the present disclosure is an application-type device including: a substrate provided with a recess; and a functional layer, ink applied with respect to the recess and then dried forming the functional layer. In the application-type device pertaining to one aspect of the present disclosure, in plan view, a surface of the functional layer is longer in a first direction than in a second direction perpendicular to the first direction, and in the second direction, the surface of the functional layer is convex, protruding upwards in a thickness direction of the functional layer, and in the first direction, the surface of the functional layer is concave, protruding downwards in the thickness direction.

In the application-type device pertaining to one aspect of the present disclosure, in plan view, the surface of the functional layer is longer in the first direction than in the second direction. Further, the surface of the functional layer is concave in the first direction and convex in the second direction. Due to this, for the same reasons as described above, at the surface of the functional layer, the concave shape in the first direction and the convex shape in the second direction cancel each other out. Thus, in the application-type device pertaining to one aspect of the present disclosure, the surface of the functional layer, which is formed within a recess, has a larger planar area than conventionally provided, similar as already described above. Accordingly, in the application-type device pertaining to one aspect of the present disclosure, the functional layer has high uniformity in terms of thickness, similar as already described above. Consequently, the application-type device pertaining to one aspect of the present disclosure also has excellent device characteristics.

In the application-type device pertaining to one aspect of the present disclosure, a ratio of a length of the functional layer in the first direction to a length of the functional layer in the second direction may be between 3:1 and 5:1. The effects achieved when the ratio of the length in the first direction to the length of the second direction is within this range and the problems that may occur when the ratio of the length in the first direction to the length of the second direction is not within this range have already been described above.

One aspect of the present disclosure is a method of manufacturing an organic light-emitting element, including: preparing a substrate; forming banks above the substrate to surround a part of an area above the substrate; applying ink containing organic material to fill a recess formed by the banks surrounding the part of the area above the substrate, and forming a layer of applied ink; and drying the layer of applied ink and forming an organic layer, the organic layer included in a light-emitting part of the organic light-emitting element. In the organic light-emitting element manufacturing method pertaining to one aspect of the present disclosure, in plan view, a surface of the organic layer, which is formed inside the recess, is longer in a first direction than in a second direction perpendicular to the first direction, and in the second direction, the surface of the organic layer is convex, protruding upwards in a thickness direction of the organic layer, and in the first direction, the surface of the organic layer is concave, protruding downwards in the thickness direction.

In the organic light-emitting element manufacturing method pertaining to one aspect of the present disclosure, the forming of the organic layer, which involves drying the layer of applied ink, is performed such that the surface of the organic layer is concave in the first direction and convex in the second direction. Due to this, at the surface of the organic layer, the concave shape in the first direction and the convex shape in the second direction cancel each other out. Thus, the surface of the organic layer has a larger planar area than conventionally provided. Accordingly, the organic light-emitting element manufacturing method pertaining to one aspect of the present disclosure achieves forming an organic layer having high uniformity in terms of thickness.

Consequently, the organic light-emitting element manufacturing method pertaining to one aspect of the present disclosure yields an organic light-emitting element having excellent element characteristics.

As already described above, an organic layer with such a surface profile can be yielded by controlling factors such as: the length, in the major-axis direction and the minor-axis direction, of the recess in which the organic layer is formed; the viscosity of the ink used for forming the organic layer; and the temperature and the speed at which the drying is performed.

In the organic light-emitting element manufacturing method pertaining to one aspect of the present disclosure, before the drying, a surface of the layer of applied ink may be convex in both the first direction and the second direction. When the surface of the layer of applied ink is convex in both the first direction and the second direction before the drying (i.e., immediately after application of ink), the shape of the layer of applied ink is more stable compared to when the surface of the layer of applied ink is convex in one direction and concave in the other direction immediately after the application of ink. When the shape of the layer of applied ink has high stability as described above, it is considered that controlling the planarization of layer the shape (surface shape) in the drying process can be facilitated.

Further, using material having liquid repellency as the material of the banks reduces the risk of the ink applied overflowing from the recess.

In the organic light-emitting element manufacturing method pertaining to one aspect of the present disclosure, a ratio of a length of the organic layer in the first direction to a length of the organic layer in the second direction may be between 3:1 and 5:1.

One aspect of the present disclosure is a method of manufacturing an organic EL display panel that includes a two-dimensional array of pixels, including forming sub-pixels of the pixels. In the organic EL display panel manufacturing method pertaining to one aspect of the present disclosure, the forming of sub-pixels in at least some of the pixels is performed according to the above method pertaining to one aspect of the present disclosure.

In the organic EL display panel manufacturing method pertaining to one aspect of the present disclosure, in at least some of the pixels, the forming of the sub-pixel is performed according to the organic light-emitting element manufacturing method pertaining to one aspect of the present disclosure. Thus, for the same reasons as described above, in at least some of the pixels, an organic layer in the sub-pixel has high uniformity in terms of thickness.

Consequently, the organic EL display panel manufacturing method pertaining to one aspect of the present disclosure yields an organic EL display panel having excellent display characteristics.

One aspect of the present disclosure is a method of manufacturing an organic EL display device that includes an organic EL display panel having a two-dimensional array of pixels, and connected to the organic EL display panel, a unit for driving and controlling the organic EL display panel, the method including manufacturing the organic EL display panel. In the organic EL display device manufacturing method pertaining to one aspect of the present disclosure, the manufacturing of the organic EL display panel is performed according to the organic EL display panel manufacturing method pertaining to one aspect of the present disclosure.

The organic EL display device manufacturing method pertaining to one aspect of the present disclosure, including manufacturing an organic EL display panel according to the organic EL display panel manufacturing method pertaining to one aspect of the present invention, yields an organic EL display device including an organic EL display panel having excellent display characteristics.

One aspect of the present disclosure is a method of manufacturing an application-type device, the method including: preparing a substrate provided with a recess; applying ink with respect to the recess; and drying the ink and forming a functional layer. In the application-type device manufacturing method pertaining to one aspect of the present disclosure, in plan view, a surface of the functional layer, which is formed inside the recess, is longer in a first direction than in a second direction perpendicular to the first direction, and in the second direction, the surface of the functional layer is convex, protruding upwards in a thickness direction of the functional layer, and in the first direction, the surface of the functional layer is concave, protruding downwards in the thickness direction.

In the application-type device manufacturing method pertaining to one aspect of the present disclosure, the surface of the functional layer, which is formed by drying the ink applied with respect to the recess, is concave in the first direction and convex in the second direction. Due to this, at the surface of the functional layer, the concave shape in the first direction and the convex shape in the second direction cancel each other out. Thus, the surface of the functional layer has a larger planar area than conventionally provided. Accordingly, the application-type device manufacturing method pertaining to one aspect of the present disclosure yields an application-type device having excellent device characteristics.

In the application-type device manufacturing method pertaining to one aspect of the present disclosure, before the drying, a surface of the ink may be convex in both the first direction and the second direction. The effects achieved when the surface of a layer of applied ink has such a surface shape have already been described above.

In the application-type device manufacturing method pertaining to one aspect of the present disclosure, a ratio of a length of the functional layer in the first direction to a length of the functional layer in the second direction may be between 3:1 and 5:1. The effects achieved when the ratio of the length in the first direction to the length of the second direction is within this range and the problems that may occur when the ratio of the length in the first direction to the length of the second direction is not within this range have already been described above.

Embodiment

When a pixel has an extremely small size where each side thereof has a length of around several hundred micrometers, and/or when forming a layer having an extremely small thickness of several tens to several hundred nanometers, in a drying process, a difference occurs between evaporation speed of a solvent at a central area of a recess surrounded by banks and evaporation speed of the solvent at end areas of the recess. This generates a force that causes a solution to flow from the central area to the end areas, which provides the layer with a shape protruding downwards (a concave shape). However, when a pixel has an extremely small size where each side thereof has a length of around several hundred micrometers and when forming a layer having an extremely small thickness as described above, forming of a layer having a shape protruding upwards (a convex shape) may be possible by controlling the conditions under which the layer is formed.

This embodiment describes an example where characteristic features of the present disclosure are applied in a process of forming a light-emitting layer included in an organic EL display panel in an organic EL display device.

<Structure of Organic EL Display Device 1>

The following describes a structure of an organic EL display device 1 pertaining to the embodiment, with reference to FIG. 1.

As illustrated in FIG. 1, the organic EL display device 1 includes an organic EL display panel 10 and a drive/control circuit 20 connected to the organic EL display panel 10. The organic EL display panel 10 is one example of an organic light-emitting device.

The organic EL display panel 10 is a panel making use of electro-luminescence of organic material. The organic EL display panel 10 includes a plurality of organic EL elements that are, for example, disposed to form a matrix. The drive/control unit 20 includes a control circuit 25 and four drive circuits, namely drive circuit 21 through drive circuit 24.

Note that in the organic EL display device 1 pertaining to the embodiment, the drive/control circuit 20 may be arranged with respect to the organic EL display panel 10 differently from the arrangement illustrated in FIG. 1.

<Overall Structure of Organic EL Display Panel 10>

Figure 2:
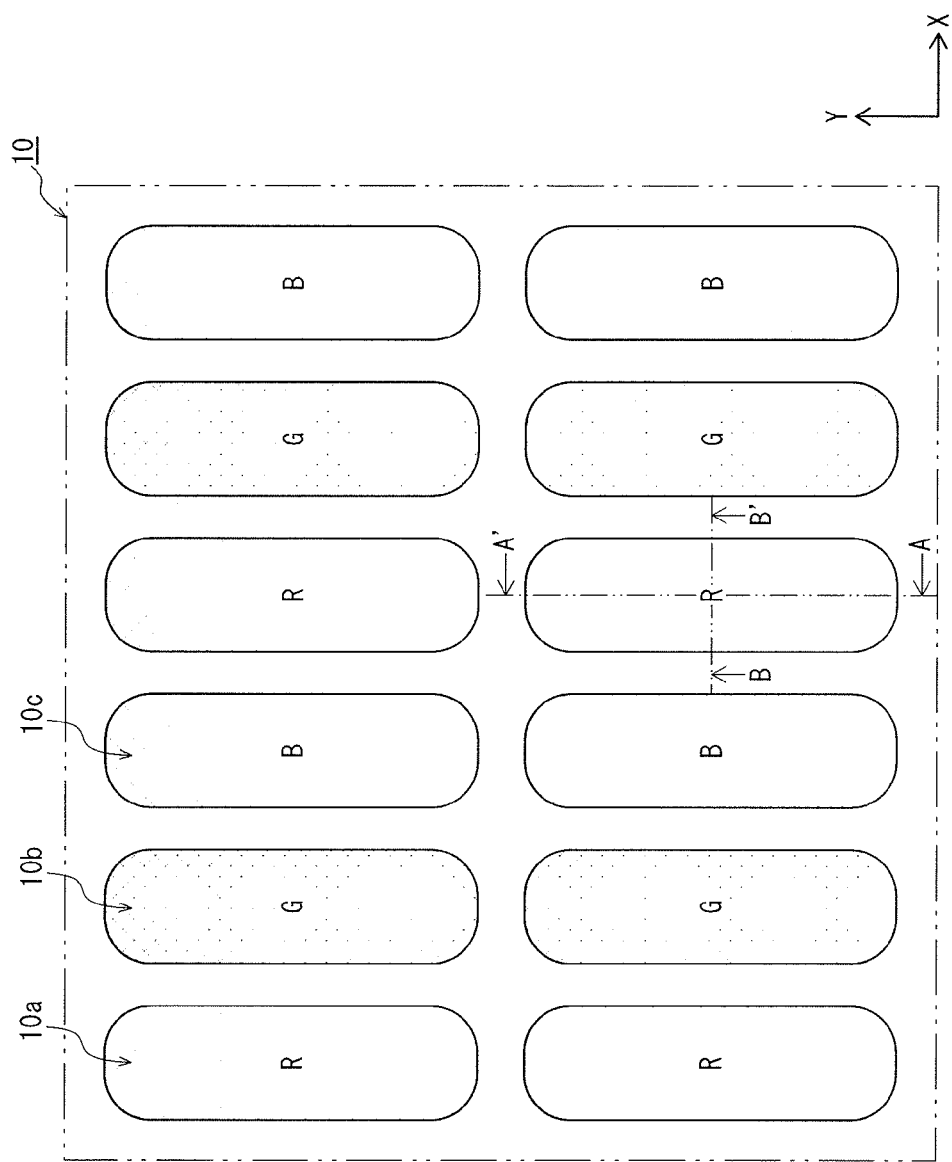
FIG. 2 is a plan view schematically illustrating part of an organic EL display panel 10 included in the organic EL display device 1.
Figure 3:
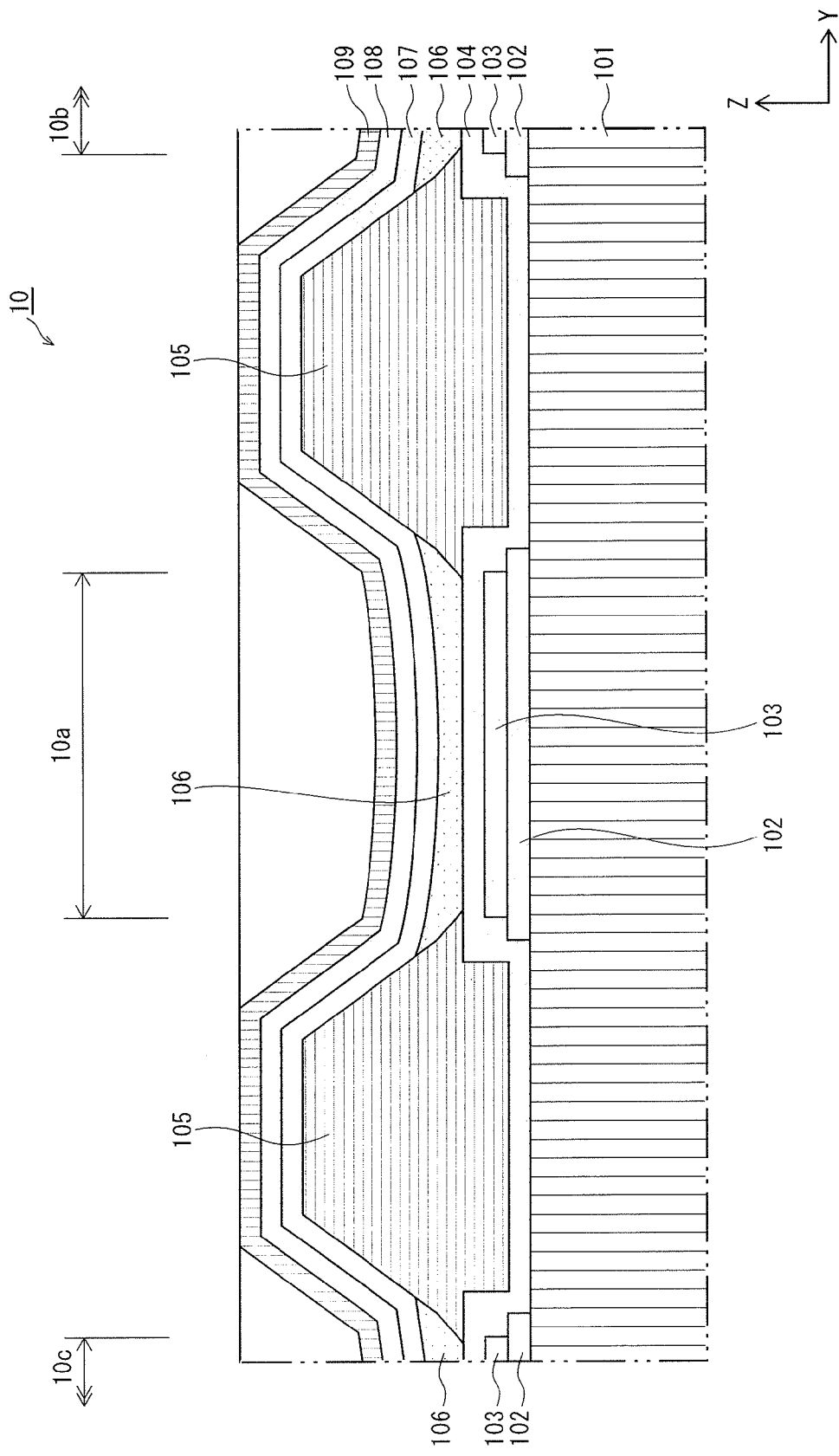
FIG. 3 is a cross-sectional view schematically illustrating part of the organic EL display panel 10.

The following describes a structure of the organic EL display panel 10, with reference to FIGS. 2 and 3. FIG. 2 is a plan view schematically illustrating part of the structure of the organic EL display panel 10. FIG. 3 is a cross-sectional view schematically illustrating a cross-section taken along line A-A' in FIG. 2.

As illustrated in FIG. 2, the organic EL display panel 10 includes, a plurality of sub-pixels (10a, 10b, 10c) disposed to form a matrix. The sub-pixels 10a, the sub-pixels 10b, and the sub-pixels 10c correspond to the light-emission colors R (red), G (green), and B (blue), respectively. A set of one sub-pixel 10b, one sub-pixel 10a adjacent to the sub-pixel 10b, and one sub-pixel 10c adjacent to the sub-pixel 10b corresponds to one pixel of the organic EL display panel 10. The organic EL display panel 10 pertaining to the embodiment is a display panel including top-emission-type organic EL elements (10a, 10b, 10c), or sub-pixels, that are arranged to form a matrix.

As illustrated in FIG. 3, in the organic EL display panel 10, an anode 102 is disposed above a TFT substrate 101 (referred to as "substrate 101" in the following). The anode 102 is disposed in plurality, to form a matrix above the substrate 101. Above the anode 102, a transparent electricity-conducting layer 103 and a hole injection layer 104 are disposed in the stated order. The transparent electricity-conducting layer 103 contains light-transmissive, electricity-conducting material such as ITO (indium tin oxide). The transparent electricity-conducting layer 103 is disposed in plurality, one for each anode 102. The transparent electricity-conducting layer 103 covers only the corresponding anode 102, while the hole injection layer 104 is disposed to extend over the entire upper surface of the substrate 101, including the upper surfaces of the anodes 102.

Above each anode 102, banks 105 are disposed above the hole injection layer 104. The banks 105 define a recess by surrounding an area above the hole injection layer 104. In the recess, a light-emitting layer 106 is disposed. Above the light-emitting layer 106, an electron injection layer 107, a cathode 108, and a sealing layer 109 are disposed. The electron injection layer 107, the cathode 108, and the sealing layer 109 are each disposed to extend out from the areas defined by the banks 105 to extend continuously over adjacent sub-pixels (organic EL elements) 10a, 10b, 10c.

<<Substrate 101>>

For example, the substrate 101 contains, as the base material thereof, an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

<<Anode 102>>

For example, the anode 201 may contain Ag (silver), APC (an alloy of silver, palladium, and copper), ARA (an alloy of silver, rubidium, and gold), MoCr (an alloy of molybdenum and chromium), or NiCr (an alloy of nickel and chromium).

<<Transparent Electricity-Conducting Layer 103>>

The transparent electricity-conducting layer 103 is disposed between the anode 102 and the hole injection layer 104 and has a function of establishing good connection between the anode 102 and the hole injection layer 104.

<<Hole Injection Layer 104>>

The hole injection layer 104 contains material having a hole injection function, such as a metal oxide, a metal nitride, or a metal oxynitride. For example, the hole injection layer 104 may contain WOx (tungsten oxide) or MoxWyOz (molybdenum tungsten oxide). The hole injection layer 104 has a portion that extends sideways and follows bottom surfaces of the banks 105.

<<Banks 105>>

The banks 105 contain organic material having electrically-insulative properties, such as resin. For example, the banks 105 may contain acrylic resin, polyimide resin, or novolac-type phenolic resin. It is preferable that the banks 105 have resistance against organic solvents. Further, the banks 105 may be subject to processing such as etching and baking. Thus, it is preferable that the banks 105 contain material that does not readily undergo deformation, degradation, etc., in such processing.

<<Light-Emitting Layer 106>>

The light-emitting layer 106 is an organic layer containing organic light-emission material (fluorescent material) of one of the light-emission colors R, G, B. Further, the light-emitting layer 106 is a functional layer in an organic EL element.

Examples of fluorescent material usable for the light-emitting layer 106 include those disclosed in Japanese Patent Application Publication No. H5-163488, which include an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound, an azaquinolone compound, a pyrazoline derivative, a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group three metal, a metal complex of oxine, and a rare earth metal complex.

It is preferable that, in each sub-pixel (10a, 10b, 10c), a ratio of a length of the light-emitting layer 106 in the major-axis direction to a length of the light-emitting layer 106 in the minor-axis direction is between 3:1 and 5:1. When the ratio of the length in the major-axis direction to the length in the minor-axis direction is within this range, the surface of the light-emitting layer 106, which is an organic layer, has a concave shape in the major-axis direction and a convex shape in the minor-axis direction.

Meanwhile, when the ratio of the length in the major-axis direction to the length in the minor-axis direction is not within this range, (i) particularly when the difference between the length in the major-axis direction and the length in the minor-axis direction is smaller than within the above range, the surface of the light-emitting layer 106 may be convex in both the first direction and the second direction, or may be concave in both directions, or (ii) particularly when the difference between the length in the major-axis direction and the length in the minor-axis direction is greater than within the above range, solid content of applied ink may be distributed unevenly at the point when drying of the ink is completed, existing at a great amount at end portions in the major-axis direction (the first direction), and the light-emitting layer 106 may not have a predetermined thickness (e.g., a thickness of around 100 nm) at a central portion of the sub-pixel.

<<Electron Injection Layer 107>>

The electron injection layer 107 has the function of injecting/transporting electrons to the light-emitting layer 106. The electrons that the electron injection layer 107 injects/transports are the electrons injected thereto from the cathode 108. It is preferable that the electron injection layer 107 contain, for example, barium, phthalocyanine, or lithium fluoride, or a combination of such materials.

Since the organic EL elements (10a, 10b, 10c) are top-emission-type organic EL elements, the cathode 108 contains light-transmissive material. For example, the light-transmissive material is ITO or IZO (indium zinc oxide).

<<Sealing Layer 109>>

The sealing layer 109 has a function of preventing the organic layer 106, etc., from being exposed to moisture and/or air. For example, the sealing layer 109 contains silicon nitride (SiN) or silicon oxynitride (SiON).

FIG. 3 illustrates a cross-section of the organic EL display panel 10 taken along line A-A' in FIG. 2. However, the banks 105 extend in both the vertical direction and the horizontal direction along the upper surface of the substrate 101, as illustrated in FIG. 2. That is, the banks 105 pertaining to the embodiment form a so-called pixel bank structure.

<Thickness Distribution in Light-Emitting Layer 106>

Figure 4:
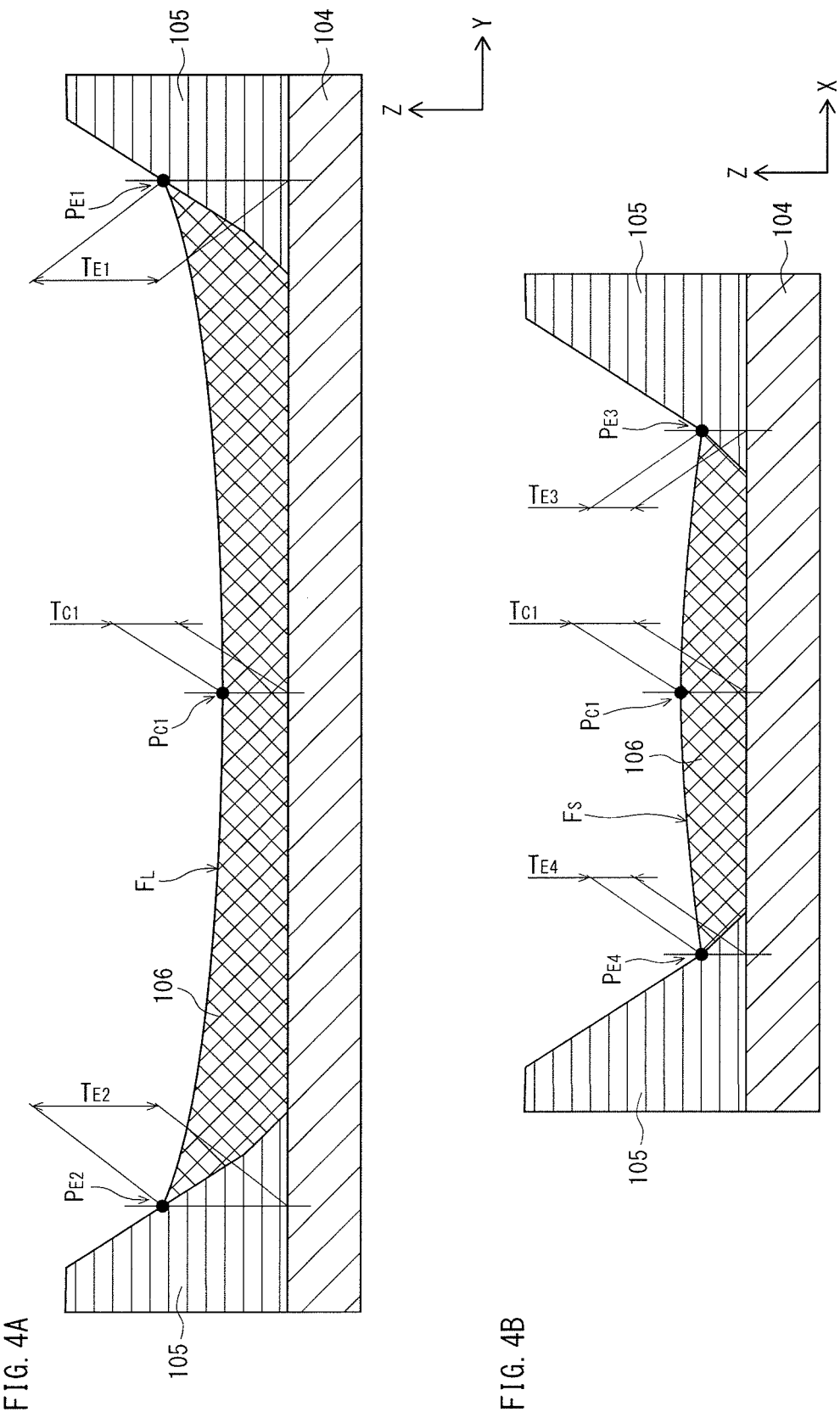
FIG. 4A is a cross-sectional view schematically illustrating part of a cross-section, in a major-axis direction, of one sub-pixel of the organic EL display panel 10.
FIG. 4B is a cross-sectional view schematically illustrating part of a cross-section, in a minor-axis direction, of one sub-pixel of the organic EL display panel 10.
Figure 5:
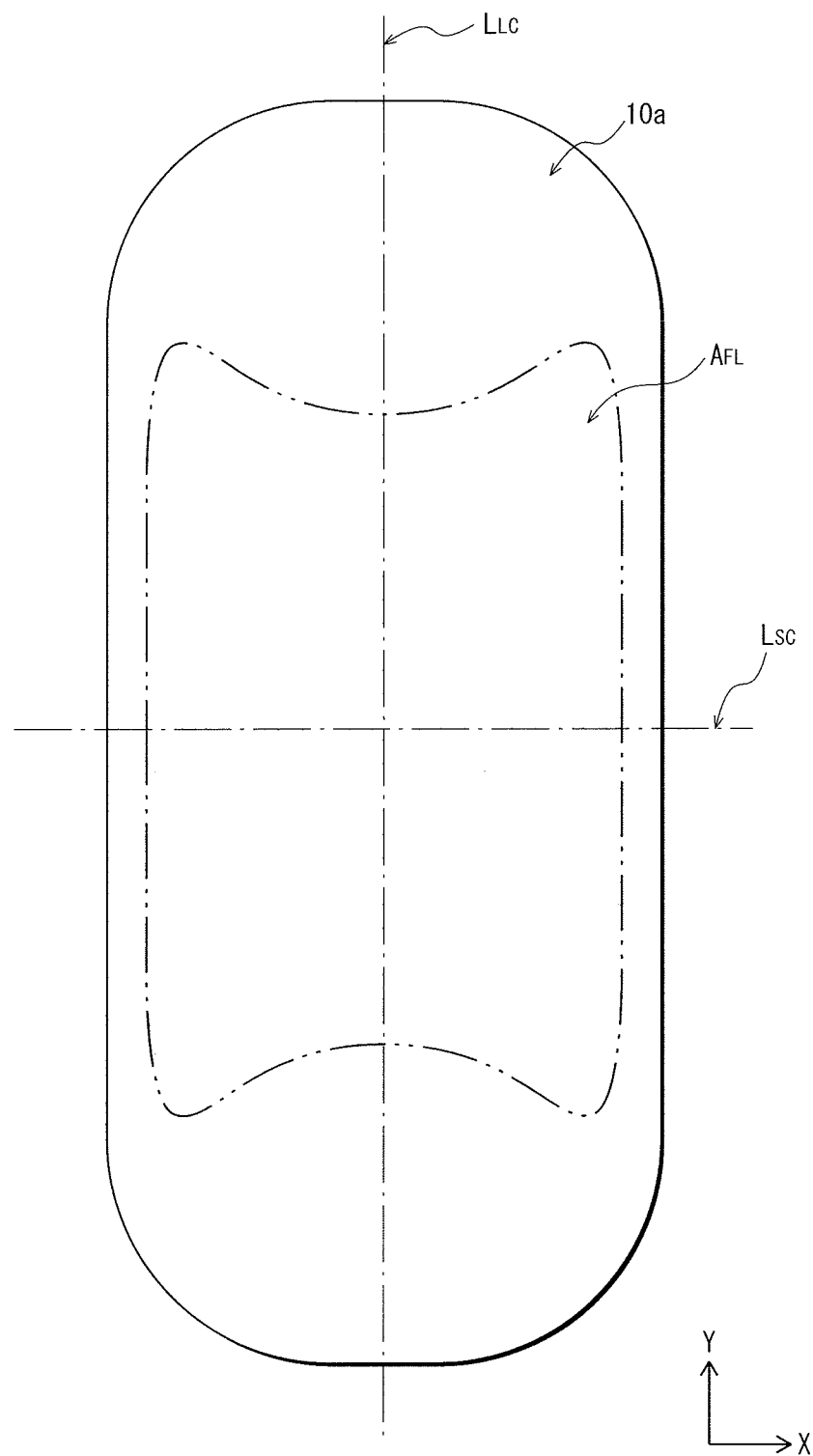
FIG. 5 is a plan view schematically illustrating a planar area of a light-emitting layer in one sub-pixel in the organic EL display panel 10.

The following describes the thickness distribution in the light-emitting layer 106 included in the organic EL display panel 10 pertaining to the embodiment, with reference to FIGS. 4A and 4B, and FIG. 5. FIG. 4A is a cross-sectional view schematically illustrating the hole injection layer 104, the banks 105, and the light-emitting layer 106 in a cross-section taken along line A-A' in FIG. 2, and FIG. 4B is a cross-sectional view schematically illustrating the hole injection layer 104, the banks 105, and the light-emitting layer 106 in a cross-section taken along line B-B' in FIG. 2. FIG. 5 is a plan view schematically illustrating an area of the light-emitting layer 106 that has the same thickness.

As illustrated in FIG. 4A, in the major-axis direction (the Y-axis direction), the light-emitting layer 106 in each sub-pixel (10a, 10b, 10c) is such that: thicknesses $T_{E1}$, $T_{E2}$ at end portions $P_{E1}$, $P_{E2}$ near the banks 105, respectively, are greater than a thickness $T_{C1}$ at a central portion $P_{C1}$. That is, the thicknesses of the different portions fulfill the following relationships.

$$T_{C1} < T_{E1} \quad \text{[Math 1]}$$

$$T_{C1} < T_{E2} \quad \text{[Math 2]}$$

As illustrated in FIG. 4A, a surface $F_L$ of the light-emitting layer 106 in the major-axis direction (the Y-axis direction) is concave, protruding downwards in the Z-axis direction.

Meanwhile, as illustrated in FIG. 4B, in the minor-axis direction (the X-axis direction), the light-emitting layer 106 in each sub-pixel (10a, 10b, 10c) is such that: thicknesses TE3, TE4 at end portions PE3, PE4 near the banks 105, respectively, are less than the thickness TC1 at the central portion PC1. That is, the thicknesses of the different portions fulfill the following relationships.

$$T_{C1} > T_{E3} \quad \text{[Math 3]}$$

$$T_{C1} > T_{E4} \quad \text{[Math 4]}$$

As illustrated in FIG. 4B, a surface $F_S$ of the light-emitting layer 106 in the minor-axis direction (the X-axis direction) is convex, protruding upwards in the Z-axis direction.

The surface of the light-emitting layer 106 in each sub-pixel (10a, 10b, 10c) is a combination of the profile of the surface $F_L$ in the major-axis direction, which is illustrated in FIG. 4A, and the profile of the surface $F_S$ in the minor-axis direction, which is illustrated in FIG. 4B. Thus, the light-emitting layer 106 in each sub-pixel (10a, 10b, 10c) of the organic EL display panel 10 pertaining to the embodiment has uniform film thickness at an area $A_{FL}$, which is indicated by cross-hatching in FIG. 5. Here, it should be noted that the area $A_{FL}$ in the organic EL display panel 10 is three to ten times larger than that in a conventional organic EL display panel. For example, when compared with that in a conventional organic EL display panel in which a surface of a light-emitting layer in each sub-pixel is concave in both the major-axis direction and the minor-axis direction, the area $A_{FL}$ in the organic EL display panel 10 is approximately ten times larger.

The profile of the surface $F_L$ of the light-emitting layer 106 in the major-axis direction (indicated by "$L_{LC}$" in FIG. 5) and the profile of the surface $F_S$ of the light-emitting layer 106 in the minor-axis direction (indicated by "$L_{SC}$" in FIG. 5) cancel each other out. It is due to this that the above effect, where the area $A_{FL}$ in the organic EL display panel 10, which is an area of the light-emitting layer 106 having uniform thickness, is larger than that in a conventional organic EL display panel, is achieved.

Here, it should be noted that in the present disclosure, when a layer has an area of uniform thickness, the thickness of the layer need not be completely the same within the area. That is, it suffices for the thickness of the layer to be within an acceptable range for achieving certain characteristics. When taking the light-emitting layer 106 as an example, the thickness of the light-emitting layer 106 within the area $A_{FL}$ may be within a range of +10 nm or +5 nm from the thickness that the light-emitting layer 106 is designed to have.

<Method of Manufacturing Organic EL Display Device 1>

Figure 6:
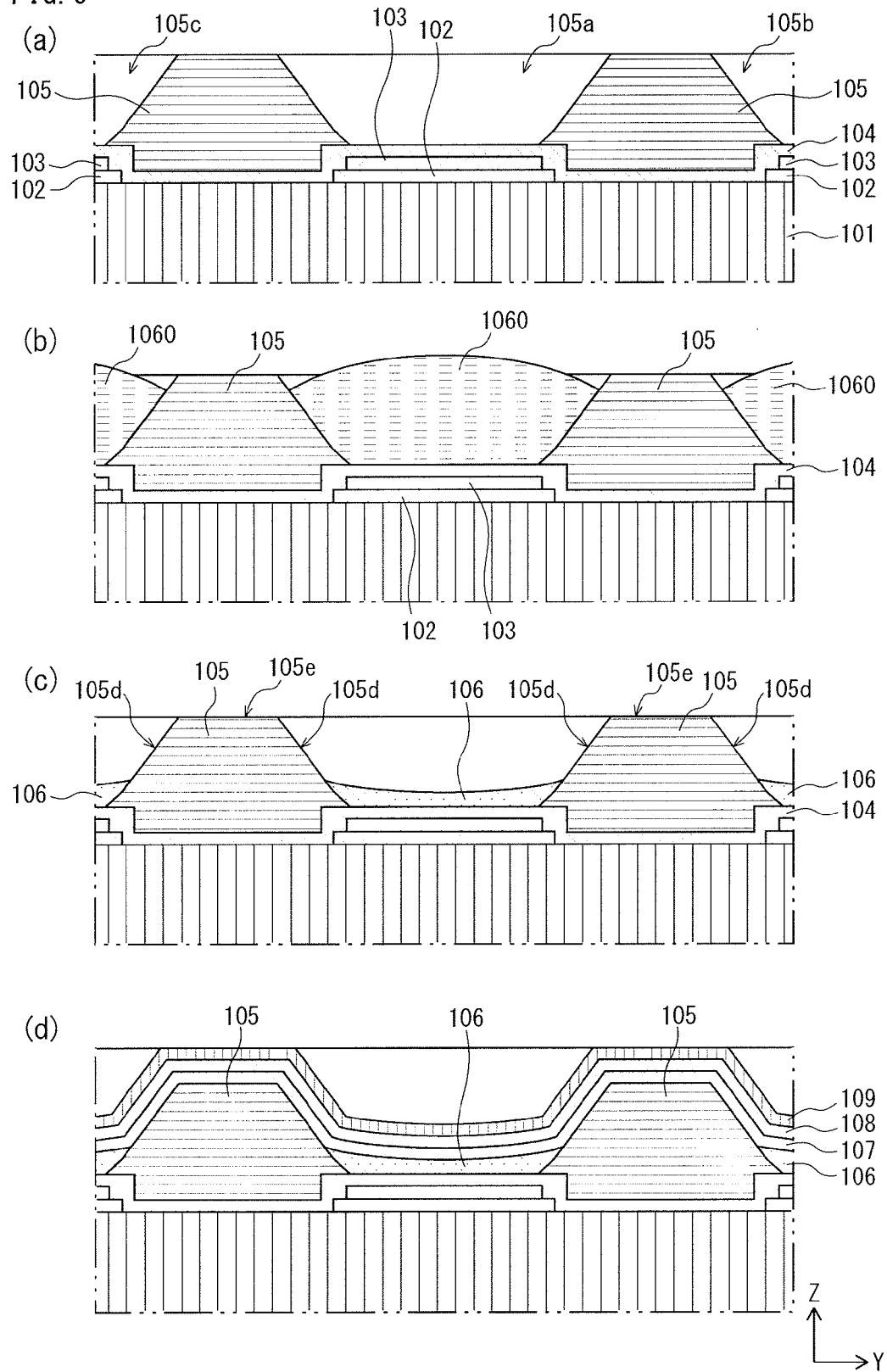
FIG. 6 including portions (a) through (d) is a process chart for explaining a method of manufacturing the organic EL display panel 10.

The following describes the method of manufacturing the organic EL display device 1, focusing on the method of manufacturing the organic EL display panel 10. Specifically, description is provided in the following while focusing on characteristic processes in the method of manufacturing the organic EL display panel 10, with reference to FIG. 6. FIG. 6, including portions (a) through (d), is a process chart for explaining the method of manufacturing the organic EL display panel 10.

As illustrated in portion (a) of FIG. 6, the anode 102, the transparent electrically-conductive layer 103, and the hole injection layer 104 are formed above the substrate 101 in the stated order. Then, the banks 105 are formed above the hole injection layer 104. The banks 105 surround an area above the hole injection layer 104, and thereby define a recess 105a. The recess 105a is an area with respect to which the light-emitting layer 106 is to be formed.

The anode 102 is formed by first forming a thin film of Ag, and then patterning the Ag thin film in a matrix-like state. Here, the forming of the Ag thin film may be performed, for example, by sputtering, and the patterning of the Ag thin film may be performed, for example, by photolithography.

The hole injection layer 104 is formed by using a composition containing WOx or MoxWyOz, and forming a layer of such material through vapor deposition or sputtering, for example.

The banks 105 are formed by first forming a layer of bank material by applying the bank material on the hole injection layer 104, and then removing parts of the bank material layer so formed. The removal of parts of the bank material layer may be performed by first forming a resist pattern on the bank material layer and then performing etching. Here, treatment for providing the surface of the bank material layer with liquid repellency may be performed when necessary. For example, plasma treatment may be performed with respect to the surface of the bank material layer, by using fluorine material.

Subsequently, as illustrated in portion (b) in FIG. 6, ink 1060 containing organic material is applied to fill the recess 105a. As a result, the recess 105a is filled with the ink 1060 containing organic light-emission material of a corresponding one of the light-emission colors R, G, and B. Then, as illustrated in portion (c) of FIG. 6, the light-emitting layer 106 is formed by decompression-drying the ink 1060 so applied. This process is explained in detail later in the present disclosure.

Portion (c) of FIG. 6 illustrates only the cross-sectional structure of the light-emitting layer 106 in the major-axis direction (the Y-axis direction). The cross-sectional structure of the light-emitting layer 106 in the minor-axis direction (the X-axis direction) is as illustrated in FIG. 4B.

Following this, as illustrated in portion (d) of FIG. 6, the electron injection layer 107, the cathode 108, and the sealing layer 109 are formed one after another. The electron injection layer 107 is formed by forming a thin film of barium by vapor deposition, for example. The electron injection layer 107, the cathode 108, and the sealing layer 109 are formed not only inside the recess 105a, but also to cover side faces 105d and upper surfaces 105e of the banks 105.

The cathode 108 is formed by forming a thin film of ITO by sputtering, for example.

<Forming Light-Emitting Layer 106>

The following describes in detail how the light-emitting layer 106 is formed.

<<Ink Preparation Process>>

The ink 1060 is prepared for each of the light-emission colors R, G, and B. The ink 1060 is prepared by dissolving organic light-emission material for the light-emitting layers 106, which is a solute, in a solvent at least containing a solvent having a relatively high boiling point (170 to 300 degrees Celsius).

Examples of the solvent having a relatively high boiling point include: cyclohexylbenzene (CHB, with boiling point of 238 degrees Celsius); diethylbenzene (with boiling point of 183 degrees Celsius); decahydronaphthalene (with boiling point of 190 degrees Celsius); methyl benzoate (with boiling point of 199 degrees Celsius); acetophenone (with boiling point of 202 degrees Celsius); phenylbenzene (with boiling point of 202 degrees Celsius); benzyl alcohol (with boiling point of 205 degrees Celsius); tetrahydronaphthalene (with boiling point of 207 degrees Celsius); isophorone (with boiling point of 213 degrees Celsius); n-dodecan (with boiling point of 216 degrees Celsius)e; dicyclohexyl (with boiling point of 227 degrees Celsius); and p-xylene glycol dimethyl ether (with boiling point of 235 degrees Celsius).

Such solvents may be used alone, or may be used by being mixed with one another. Further, such solvents, each of which having a relatively high boiling point, may be used by being mixed with another solvent having a relatively low boiling point of lower than 170 degrees Celsius.

<<Ink Filling Process>>

The ink 1060 of a corresponding one of the light-emission colors R, G, and B is applied to fill each recess 105a formed above the substrate 101. The application of the ink 1060 is performed according to inkjet printing (a method of ejecting ink droplets).

Other methods according to which the application of the ink 1060 may be performed include: ink dispensing; nozzle coating; spin coating; intaglio printing; and relief printing.

Portion (b) of FIG. 6 only provides illustration along the major-axis direction of the recess 105a. Note that when the ink 1060 is applied to fill the recess 105a, the surface of the ink 1060 in the recess 105a is convex, protruding upwards in the thickness direction (the Z-axis direction) in both the major-axis direction and the minor-axis direction of the recess 105a. This is due to surfaces of the banks 105 having liquid-repellency. It is considered that when the surface of the ink 1060 (a surface of a layer of applied ink) is convex in both the major-axis direction and the minor-axis direction before drying (i.e., immediately after application), the shape of the layer of applied ink is more stable compared to when the surface of the ink 1060 is convex in one direction and concave in the other direction immediately after application. When the shape of the layer of applied ink has high stability as described above, it is considered that controlling the planarization of layer shape (surface shape) in the drying process can be facilitated. Further, using material having liquid repellency as the material of the banks 105 reduces the risk of the ink 1060 applied overflowing from the recess 105a.

<<Drying Process>>

Figure 7:
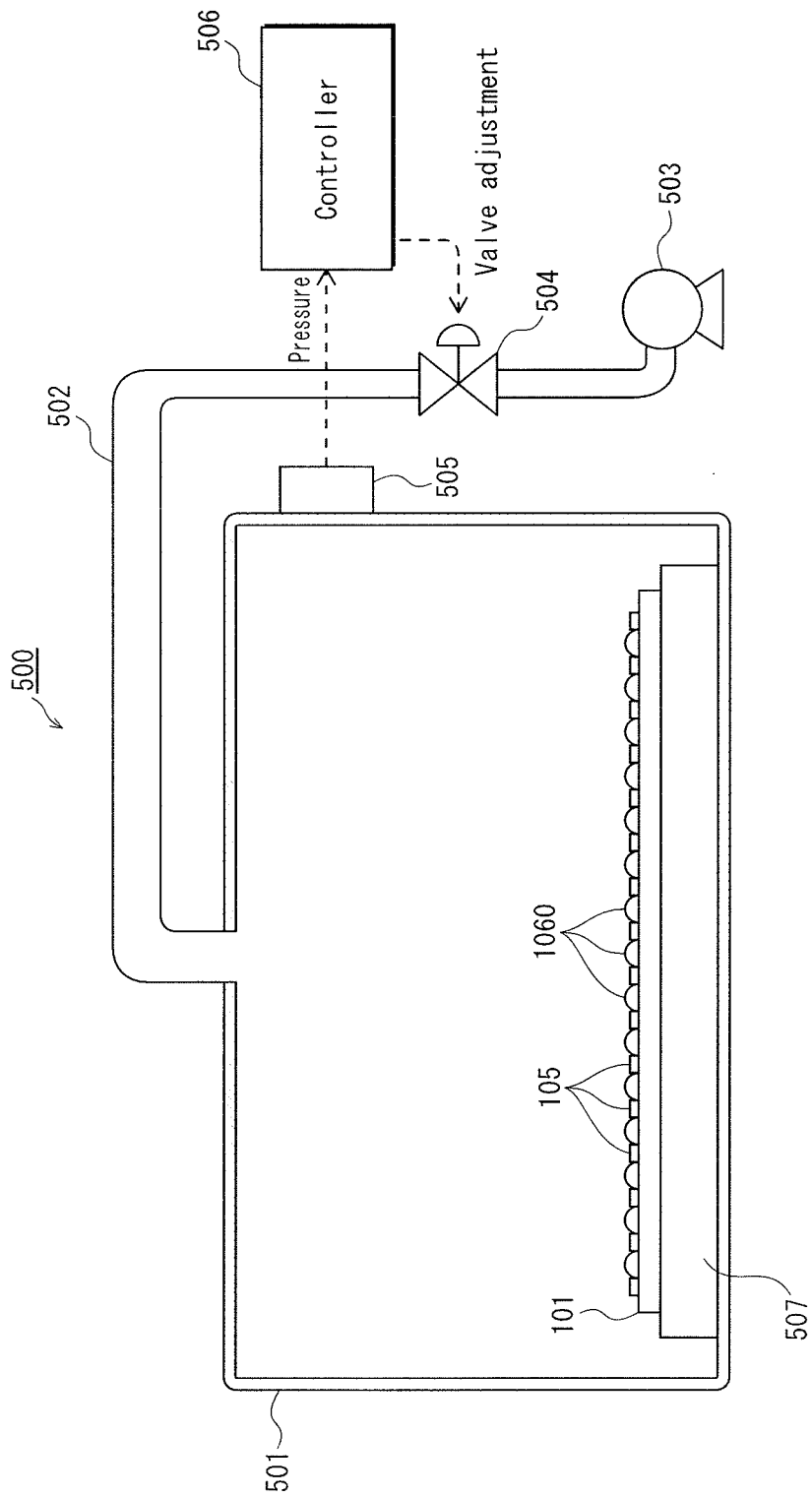
FIG. 7 is a schematic diagram illustrating an overall structure of a drying device 500 used for manufacturing the organic EL display panel 10.

The substrate 101 having the ink 1060 of the light-emission colors R, G, and B applied thereon is placed inside a drying chamber 501 of a drying device 500, which is illustrated in FIG. 7. Drying is performed by causing the solvent in the ink 1060 to evaporate in decompressed atmosphere.

FIG. 7 is a diagram illustrating an overall structure of the drying device 500, which is used in the drying process in the manufacturing of the organic EL display panel 10.

The drying device 500 includes: the drying chamber 501; an exhaust pipe 502; a vacuum pump 503; a valve 504 for controlling exhaust conductance in the exhaust pipe 502; a pressure gauge 505 for measuring the pressure in the drying chamber 501; and a controller 506 for controlling the exhaust conductance in the exhaust pipe 502 via the valve 504 according to the measurement result indicated by the pressure gauge 505.

Further, the drying device 500 includes, inside the drying chamber 501, a support part 507 that supports the substrate 101. Note that when performing the drying process while heating the substrate 101, a heater, for example, is placed inside the drying chamber 501, which also functions as a heating room in such a case.

The drying chamber 501, which is a decompression vessel, has a door (undepicted) provided to a side surface thereof. The door is for placing the substrate 101 in the drying chamber 501 and removing the substrate 101 from the drying chamber 501, and enables closing up the drying chamber 501 in airtight state.

The vacuum pump 503 is capable of reducing the pressure inside the drying chamber 501 to lower than or equal to 10 Pa. For example, the vacuum pump 503 may be a combination of a mechanical booster pump and a rotary pump. Alternatively, switching between such pumps may be performed according to the pressure in the drying chamber 501. For example, only the rotary pump may be initially used for initial evacuation from atmospheric pressure, and then the rotary pump and the mechanical booster pump may be used in combination after the quality of the vacuum has reached a high level.

By using this drying device 500, decompression-drying of the ink 1060 is performed as described in the following.

First, the substrate 101 having the ink 1060 applied thereon is placed on the support part 507 in the drying chamber 501, and the drying chamber 501 is closed up in airtight state. The temperature in the drying chamber 501 is set to 25 degrees Celsius at this initial state.

Subsequently, the pressure inside the drying chamber 501 is reduced by using the vacuum pump 503.

Figure 8:
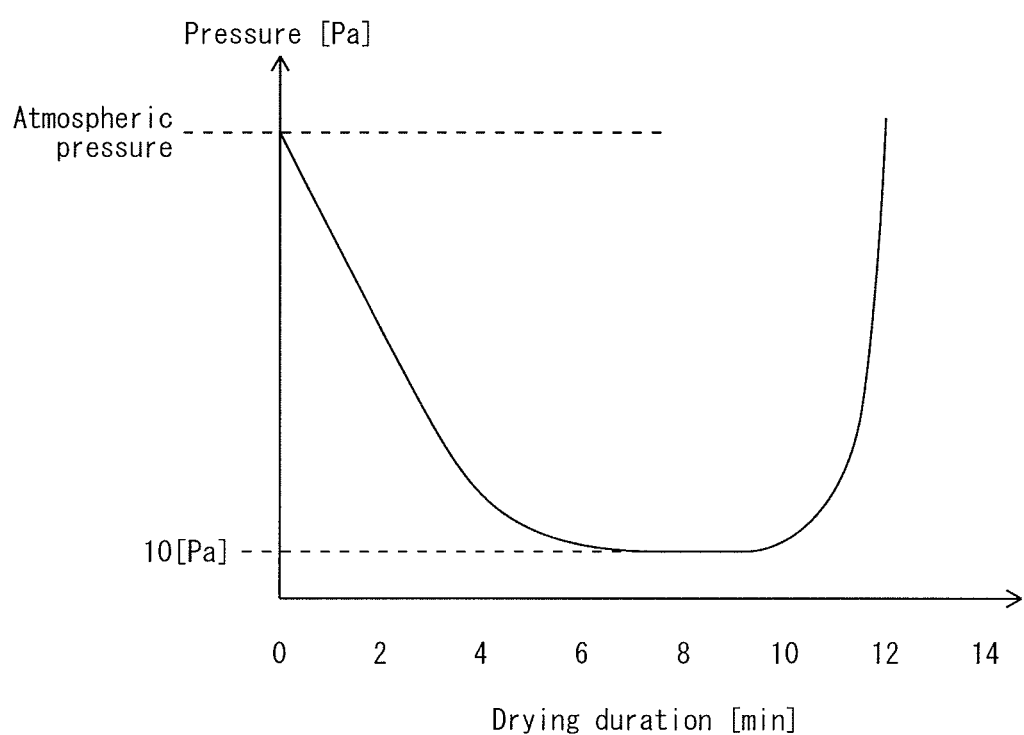
FIG. 8 is a graph illustrating an example of a pressure profile in a decompression vessel.

FIG. 8 illustrates an example of the pressure profile (a chronological change in pressure) in the drying chamber 501.

In this example, the pressure in the drying chamber 501 is reduced from atmospheric pressure to a pressure of around 10 Pa in approximately seven minutes. Subsequently, the pressure in the drying chamber 501 is maintained at 10 Pa for about three minutes by appropriately adjusting the valve 504.

Reducing the pressure in the drying chamber 501 in such a manner results in evaporation of the solvent in the ink 1060 and the consequent forming of the light-emitting layers 106.

Following this, the valve 504 is closed, whereby atmospheric air is introduced into the drying chamber 501 and the pressure in the drying chamber 501 returns to atmospheric level. Then, the substrate 101 is taken out from the drying chamber 501.

As illustrated in portion (c) of FIG. 6, in the major-axis direction of the recess 105a, the light-emitting layer 106 is concave, protruding downwards in the thickness direction (the Z-axis direction), after the drying process. Meanwhile, in the minor-axis direction of the recess 105a, the light-emitting layer 106 is convex, protruding upwards in the thickness direction (the Z-axis direction), after the drying process. That is, after the drying, the light-emitting layer 106 has a shape similar to that illustrated in FIG. 4A in the major-axis direction, and has a shape similar to that illustrated in FIG. 4B in the minor-axis direction.

<Effects of Drying in Embodiment>

The following describes the effects of the above-described drying process in detail, with reference to FIG. 9.

Drying with relatively low pressure in the drying chamber 501 (i.e., drying in a high-vacuum) causes ink solvent to evaporate at a higher rate compared to drying with relatively high pressure (i.e., drying in a low-vacuum). Under this condition, when referring to a puddle of the ink 1060 (a layer of the applied ink 1060) in one area where an element is to be formed (i.e., in one recess 105a), the evaporation speed at end areas (areas near the banks 105) of the recess 105a becomes considerably greater than the evaporation speed at a central area (an area distant from the banks 105) of the recess 105a, as indicated by the arrows in portion (a) of FIG. 9.

The following, which describes how vapor generated by the evaporation of ink solvent spreads near the surface of the puddle of the ink 1060, serves as an explanation of the above. Vapor generated at the central area spreads almost only upwards, without spreading sideways, due to the source of vapor (i.e., ink), existing at both sides thereof in a lateral direction. In contrast, vapor generated at each end area spreads not only upwards but also sideways, due to a bank 105, from which vapor is not generated, existing at a side thereof in the lateral direction.

Particularly when each sub-pixel (10a, 10b, 10c), or in other words, the recess 50a, has an extremely small size where a side thereof has a length La no greater than 500 μm, the difference between the evaporation speed at the central area and the evaporation speed at the end areas becomes even greater, due to ink solvent evaporating under higher pressure.

Although the puddle of the ink 1060 has the ability to self-planarize by leveling, when the difference between evaporation speeds at the central area and the end areas becomes great, ink fluid in the puddle of the ink 1060 flows from the central area, at which ink solvent evaporates at low speed, to the end areas, at which ink solvent evaporates at high speed. This results in the solute (light-emitting layer material) in the ink 1060 accumulating at the end areas, due to ink fluid flowing thereinto from the central area and only the solvent evaporating from the ink 1060.

This results in a light-emitting layer having greater thickness at end portions thereof than at a central portion thereof, as illustrated in portion (b) of FIG. 9 being formed. Accordingly, the light-emitting layer so formed has nonuniform thickness as illustrated in portion (b) of FIG. 9.

Meanwhile, the light-emitting layer 106 in the embodiment has a concave shape in the major-axis direction and has a convex shape in the minor-axis direction. This is achieved by making a configuration as described in the following. In this configuration, the length of each sub-pixel (10a, 10b, 10c) in the major-axis direction is set to no shorter than 100 μm and no longer than 600 μm, the length of each sub-pixel (10a, 10b, 10c) in the minor-axis direction is set to no shorter than 10 μm and no longer than 90 μm, the viscosity of the ink 1060 is set to no smaller than 2 mPa·s and no greater than 21 mPa·s, and the temperature in the drying process is set to no lower than 20 degrees Celsius and no higher than 100 degrees Celsius. By making such a configuration and further, when the decompression-drying rate until a pressure of 1000 Pa is reached is controlled to be within a range of no lower than −999000 Pa/sec and no higher than −10000 Pa/min, each light-emitting layer in a pixel (i.e., the light-emitting layer 106) tends to have a concave shape in the major-axis direction and tends to have a convex shape in the minor-axis direction.

More specifically, in the major-axis direction, the sub-pixel has a length no shorter than 100 µm and no longer than 600 µm and the movement of ink solute to the end areas of the sub-pixel occurs for a sufficient period of time before the flow of solute stops, which results in the light-emitting layer 106 having a concave shape in the major-axis direction. Meanwhile, in the minor-axis direction, the sub-pixel has a short length of no shorter than 10 µm and no longer than 90 µm, which results in the light-emitting layer 106 having a convex shape in the minor-axis direction. Accordingly, the shape of the light-emitting layer 106 in the minor-axis direction and the shape of the light-emitting layer 106 in the major-axis direction cancel each other out, which results in the light-emitting layer 106 being relatively planar within a large area. Thus, the light-emitting layer 106 has excellent uniformity in terms of thickness.

<Experiment>

The following describes an experiment conducted to confirm the effects described above.

<<Forming Recess>>

Banks were formed on flat glass substrates by spin-applying photosensitive material with respect to the glass substrates and performing patterning by photolithography. The banks were formed to surround an area above each glass substrate, or more specifically, to define a rectangular recess (a groove) longer in a vertical direction than in a horizontal direction above each glass substrate. Here, the banks defining the recess are to be understood as having the shape illustrated in FIG. 2.

Further, the ratio of the length of the recess in the major-axis direction to the length of the recess in the minor-axis direction is, for example, between 4:1 and 5:1.

<<Ink Preparation>>

Polyfluorene polymer (poly(9,9-di-n-dodecylfluorenyl-2,7-diyl), produced by Aldrich Chemical Co.) was used as ink solute, and butyl benzoate (with a boiling point of 242 degrees Celsius) was used as ink solvent.

Ink was prepared by measuring butyl benzoate and polyfluorene polymer by using a balance scale, and then causing polyfluorene polymer to dissolve sufficiently in butyl benzoate through application of vibration by using a bio shaker (dissolution temperature: 60 degrees Celsius; mixing speed: 100 rpm). As illustrated in FIG. 11A, two types of ink were prepared through the above procedures, one having a viscosity of 10.3 mPa·s and the other having a viscosity of 12.3 mPa·s.

<<Ink Application>>

Ink was applied to fill recesses formed above the glass substrates by performing inkjet printing.

<<Drying>>

Samples were produced by performing the decompression-drying described above. In specific, five samples were produced for each type of ink, by applying different drying temperatures of 25 degrees Celsius, 50 degrees Celsius, 60 degrees Celsius, 70 degrees Celsius, and 80 degrees Celsius, as illustrated in FIG. 11A.

Further, the thickness distribution (in both the major-axis and minor-axis directions) of a light-emitting layer formed in the recess in each of the samples so produced was measured by using an atomic force microscope (AFM).

The following describes the results of the measurement. In all samples, the light-emitting layer had a concave shape in the major-axis direction. Meanwhile, the measurement results and the judgment results of the minor-axis direction surface profiles of the light-emitting layers in the samples are illustrated in FIG. 11B. In each of samples 1, 2, 9, and 10 (implementation examples), the light-emitting layer was convex in the minor-axis direction, as illustrated in FIG. 10B. Thus, it can be expected that in such samples, the surface of the light-emitting layer has a relatively large planar area, and consequently, the light-emitting layer has uniform thickness over a large area.

Figure 10A:
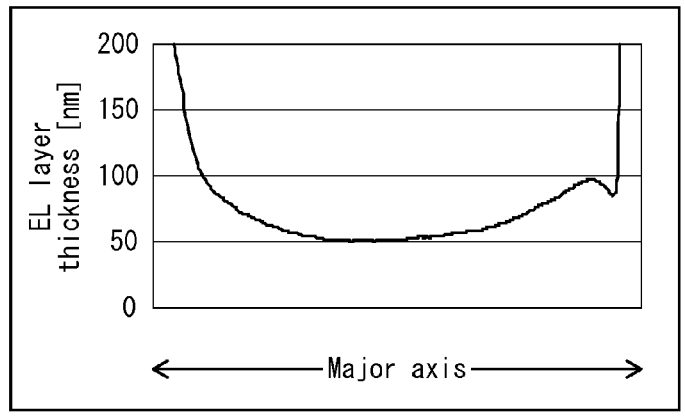
FIG. 10A schematically illustrates a shape of a cross-section, in a major-axis direction, of an organic layer in a confirmation test, FIG. 10B schematically illustrates a shape of a cross-section, in a minor-axis direction, of the organic layer in the confirmation test, and FIG. 10C schematically illustrates a thickness distribution, calculated from FIGS. 10A and 10B, of the organic layer in the confirmation test within a recess.
Figure 10B:
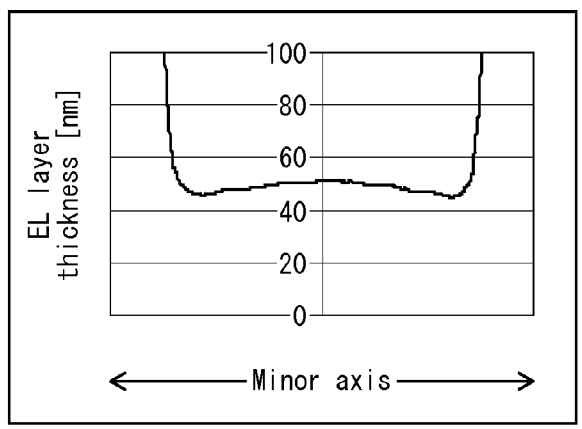
Figure 10C:
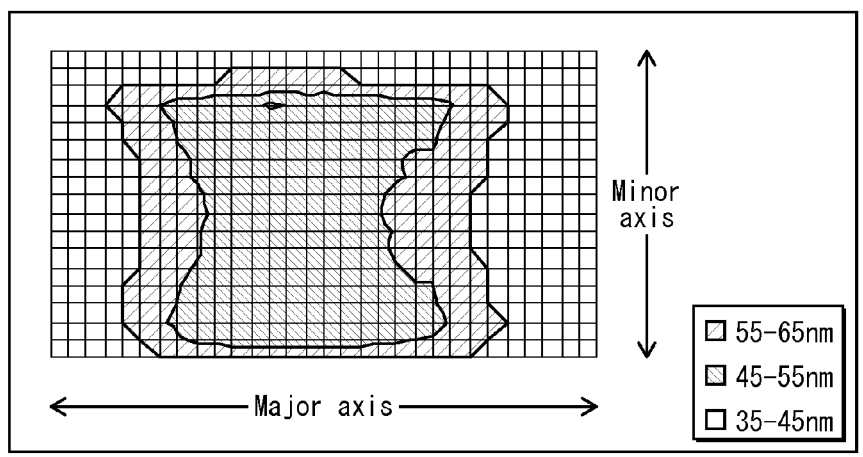

FIG. 10A illustrates a surface profile of a light-emitting layer in one implementation example in the major-axis direction, and FIG. 10B illustrates a surface profile of the same light-emitting layer in the minor-axis direction. The surface profiles were yielded by measuring the thickness distribution of the light-emitting layer by using an atomic force micrometer. FIG. 10C illustrates an overall thickness direction of the light-emitting layer within the entirety of the recess in which the light-emitting layer is formed, which is calculated by combining the surface profile in the major-axis direction and the surface profile in the minor-axis direction.

Here, a thickness between 45 nm and 55 nm is considered as being a preferable thickness of the light-emitting layer.

In FIG. 11B, a sample whose light-emitting layer had a good level of planarity (a large effective area) is indicated by "OK", whereas a sample whose light-emitting layer had a poor level of planarity (a small effective area) is indicated by "NG".

As already discussed above, in all of the samples 1 through 10, the light-emitting layer had a concave shape in the major-axis direction.

When the light-emitting layer has a concave shape in the minor-axis direction, the light-emitting layer has poor planarity (a small effective area) within the recess. This applies to samples 3 through 8.

On the other hand, when the light-emitting layer has a convex shape in the minor-axis direction, the concave shape of the light-emitting layer in the major-axis direction and the convex shape of the light-emitting layer in the minor-axis direction cancel each other out. This results in the light-emitting layer having a thickness distribution of high planarity (a large effective area). This applies to samples 1, 2, 9, and 10.

Figure 12:
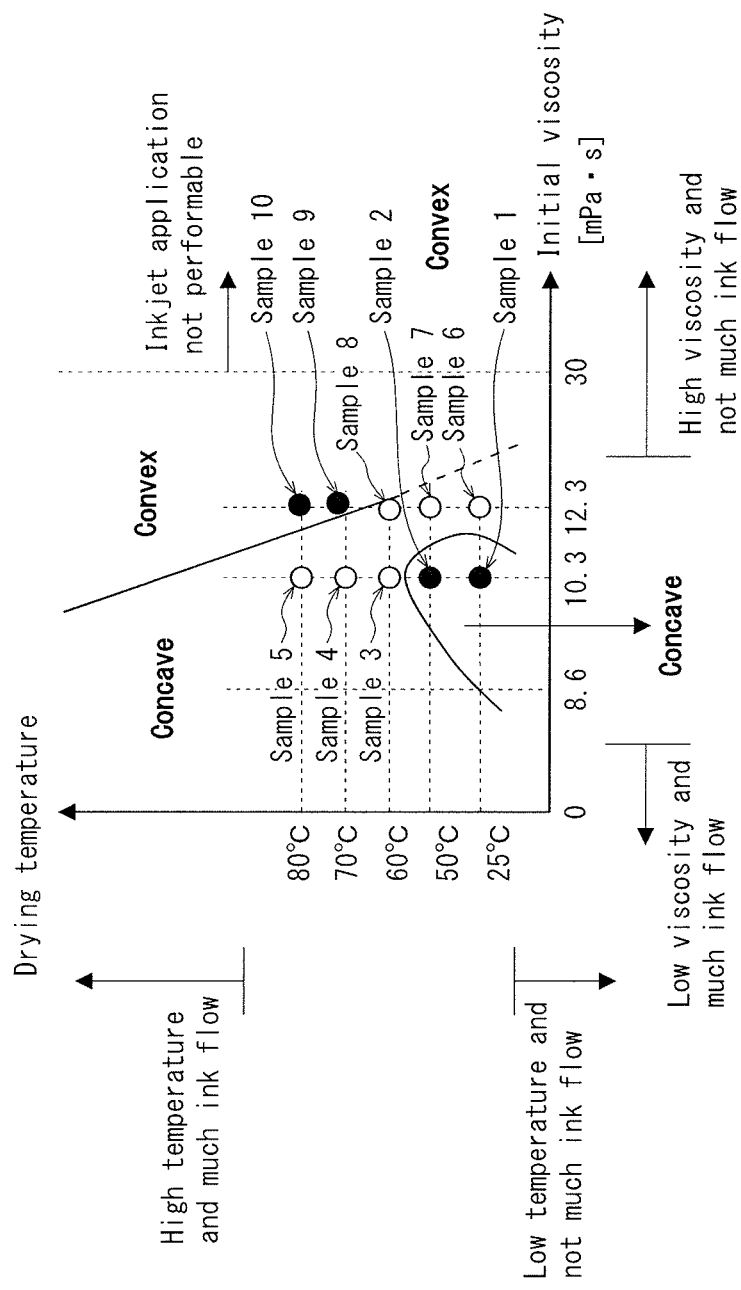
FIG. 12 is a diagram schematically illustrating a relation between surface profiles of cross-sections, in a minor-axis direction, of organic layers and initial ink viscosities and drying temperatures in forming organic layers.

FIG. 11A illustrates ten samples used in the experiment, which were produced by changing initial ink viscosity and drying temperature. FIG. 12 illustrates the relationship of initial ink viscosities and drying temperatures of the ten samples. Note that as illustrated in FIG. 12, conditions other than those illustrated in FIG. 11A may also yield a light-emitting layer having a convex shape in the minor-axis direction.

(Modifications)

(1) In the embodiment, description is provided taking as an example a case where the technology of the present disclosure is applied in the process of forming light-emitting layers each in a recess surrounded by banks, which is performed when forming a plurality of EL elements on a substrate. Alternatively, the technology of the present disclosure is similarly applicable in a process of forming a functional layer other than a light-emitting layer, such as a charge injection/transport layer, in a recess surrounded by banks through application of a wet process. The technology of the present disclosure is expected to achieve similar effects as those described above when applied in such a process.

(2) In the embodiment, description is provided taking as an example a case where the technology of the present disclosure is applied in forming light-emitting layers 106 in the organic EL display panel 10, which is a top-emission-type organic EL display panel. Alternatively, the technology of the present disclosure is similarly applicable in forming light-emitting layers in a bottom-emission-type organic EL display panel. In addition, the technology of the present disclosure, which is applied in forming a light-emitting layer in an organic EL element in the embodiment, is also applicable in forming a charge transport layer in an organic EL element.

(3) In the embodiment, description is providing taking as an example a case where the technology of the present disclosure is applied to an organic EL element. Alternatively, the technology of the present disclosure is also applicable in applying ink between adjacent ribs in a plasma display panel.

INDUSTRIAL APPLICABILITY

The technology of the present disclosure is useful in the technical field of forming a functional film by applying and drying ink. The technology of the present disclosure is applicable in the manufacturing of organic EL display panels, organic EL light sources, and the like. The technology of the present disclosure yields an organic EL display panel exhibiting uniform light-emission characteristics within a substrate surface. The technology of the present disclosure, through achieving uniform light-emission characteristics within an image display area as described above, also achieves improvement in image quality.

REFERENCE SIGNS LIST 1 organic EL display device
10 organic EL display panel
10a, 10b, 10c sub-pixel
20 drive/control circuit
21-24 drive circuit
25 control circuit
101 TFT substrate
102 anode
103 transparent electricity-conducting layer
104 hole injection layer
105 banks
105a, 105b, 105c recess
106 light-emitting layer
107 electron injection layer
108 cathode
109 sealing layer
500 drying device
501 drying chamber
502 exhaust pipe
503 vacuum pump
504 valve
505 pressure gauge
506 controller
507 support part
1060 ink

The invention claimed is:

1. An organic light-emitting element comprising:
a substrate;
a light-emitting part above the substrate, the light-emitting part including an organic layer; and
banks defining bounds of the organic layer in a direction along a main surface of the substrate, wherein
in plan view, a surface of the organic layer is longer in a first direction than in a second direction perpendicular to the first direction, and
in the second direction, the surface of the organic layer is convex, protruding upwards in a thickness direction of the organic layer, and in the first direction, the surface of the organic layer is concave, protruding downwards in the thickness direction.

2. The organic light-emitting element of claim 1, wherein
in the second direction, a central portion of the surface of the organic layer protrudes upwards in the thickness direction to be higher than end portions of the surface of the organic layer, and
in the first direction, end portions of the surface of the organic layer protrude upwards in the thickness direction to be higher than the central portion of the surface of the organic layer.

3. The organic light-emitting element of claim 1, wherein ink containing organic material, applied with respect to a recess surrounded by the banks and then dried, forms the organic layer.

4. The organic light-emitting element of claim 1, wherein a ratio of a length of the organic layer in the first direction to a length of the organic layer in the second direction is between 3:1 and 5:1.

5. An organic EL display panel comprising
a two-dimensional array of pixels each including a sub-pixel, wherein
in at least some of the pixels, the sub-pixel has the structure of the organic light-emitting element of claim 1.

6. An organic EL display device comprising
the organic EL display panel of claim 5.

7. An application-type device comprising:
a substrate provided with a recess; and
a functional layer, ink applied with respect to the recess and then dried forming the functional layer, wherein
in plan view, a surface of the functional layer is longer in a first direction than in a second direction perpendicular to the first direction, and
in the second direction, the surface of the functional layer is convex, protruding upwards in a thickness direction of the functional layer, and in the first direction, the surface of the functional layer is concave, protruding downwards in the thickness direction.

8. The application-type device of claim 7, wherein
a ratio of a length of the functional layer in the first direction to a length of the functional layer in the second direction is between 3:1 and 5:1.

9. A method of manufacturing an organic light-emitting element, comprising:
preparing a substrate;
forming banks above the substrate to surround a part of an area above the substrate;
applying ink containing organic material to fill a recess formed by the banks surrounding the part of the area above the substrate, and forming a layer of applied ink; and
drying the layer of applied ink and forming an organic layer, the organic layer included in a light-emitting part of the organic light-emitting element, wherein
in plan view, a surface of the organic layer, which is formed inside the recess, is longer in a first direction than in a second direction perpendicular to the first direction, and
in the second direction, the surface of the organic layer is convex, protruding upwards in a thickness direction of the organic layer, and in the first direction, the surface of the organic layer is concave, protruding downwards in the thickness direction.

10. The method of claim 9, wherein
before the drying, a surface of the layer of applied ink is convex in both the first direction and the second direction.

11. The method of claim 9, wherein
a ratio of a length of the organic layer in the first direction to a length of the organic layer in the second direction is between 3:1 and 5:1.

12. A method of manufacturing an organic EL display panel that includes a two-dimensional array of pixels, comprising
forming sub-pixels of the pixels, wherein
the forming of sub-pixels in at least some of the pixels is performed according to the organic light-emitting element manufacturing method of claim 9.

13. A method of manufacturing an organic EL display device that includes an organic EL display panel having a two-dimensional array of pixels, and connected to the organic EL display panel, a unit for driving and controlling the organic EL display panel, the method comprising
manufacturing the organic EL display panel, wherein
the manufacturing of the organic EL display panel is performed according to the method of claim 12.

14. A method of manufacturing an application-type device, the method comprising:
preparing a substrate provided with a recess;
applying ink with respect to the recess; and
drying the ink and forming a functional layer, wherein
in plan view, a surface of the functional layer, which is formed inside the recess, is longer in a first direction than in a second direction perpendicular to the first direction, and
in the second direction, the surface of the functional layer is convex, protruding upwards in a thickness direction of the functional layer, and in the first direction, the surface of the functional layer is concave, protruding downwards in the thickness direction.

15. The method of claim 14, wherein
before the drying, a surface of a layer of the applied ink is convex in both the first direction and the second direction.

16. The method of claim 14, wherein
a ratio of a length of the functional layer in the first direction to a length of the functional layer in the second direction is between 3:1 and 5:1.

* * * * *